United States Patent
Huang

(10) Patent No.: US 10,152,097 B1
(45) Date of Patent: Dec. 11, 2018

(54) HEAT-DISSIPATING DEVICE FOR EXPANSION CARD AND EXPANSION CARD ASSEMBLY WITH HEAT-DISSIPATING FUNCTION

(71) Applicant: ADATA TECHNOLOGY CO., LTD., New Taipei (TW)

(72) Inventor: Chih-Chun Huang, Taipei (TW)

(73) Assignee: ADATA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/862,969

(22) Filed: Jan. 5, 2018

(30) Foreign Application Priority Data

Sep. 29, 2017 (TW) .............................. 106133735 A

(51) Int. Cl.
| H05K 7/00 | (2006.01) |
| H05K 5/00 | (2006.01) |
| G06F 1/20 | (2006.01) |
| H05K 7/20 | (2006.01) |

(52) U.S. Cl.
CPC ........... *G06F 1/20* (2013.01); *H05K 7/20418* (2013.01)

(58) Field of Classification Search
CPC ....................................................... H05K 7/20
USPC ..................................................... 361/679.01
See application file for complete search history.

(56) References Cited

U.S. PATENT DOCUMENTS

| 2008/0251911 | A1* | 10/2008 | Farnsworth | ......... H01L 23/4093 |
| | | | | 257/714 |
| 2009/0129026 | A1* | 5/2009 | Baek | ................... H01L 23/3672 |
| | | | | 361/710 |
| 2011/0310563 | A1* | 12/2011 | Meyer, IV | .......... F28D 15/0233 |
| | | | | 361/704 |

FOREIGN PATENT DOCUMENTS

| CN | 1221030 C | 9/2005 |
| CN | 102802379 A | 11/2012 |
| TW | 491510 | 6/2002 |
| TW | M544192 U | 6/2017 |
| TW | M547692 U | 8/2017 |

* cited by examiner

*Primary Examiner* — Jerry Wu
(74) *Attorney, Agent, or Firm* — Li & Cai Intellectual Property (USA) Office

(57) ABSTRACT

A heat-dissipating device for expansion card is provided. The expansion card has a printed circuit card. The printed circuit card has an inserting-type connecter at one end thereof and a securing hole formed at the other end thereof. The heat-dissipating device includes a base plate, a plurality of cooling fins protruded from the base plate, a screwing portion, and at least one hooking part. The base plate has a flat bottom surface, a first side and a second side opposite to the first side. The screwing portion is formed at the first side of the base plate. The position of the screwing portion is corresponding to that of the securing hole of the expansion card. The at least one hooking part is disposed at the second side of the base plate and is hooked with one side of the printed circuit card.

9 Claims, 6 Drawing Sheets

HEAT-DISSIPATING DEVICE FOR EXPANSION CARD AND EXPANSION CARD ASSEMBLY WITH HEAT-DISSIPATING FUNCTION

BACKGROUND OF THE INVENTION

1. Field of the Invention

The present disclosure is related to a heat-dissipating device for an expansion card and an expansion card assembly with heat-dissipating function. In particular, the present disclosure relates to a heat-dissipating device capable of providing the expansion card with cooling function, and an expansion card assembly with heat-dissipating function which includes an expansion card and a heat-dissipating device.

2. Description of Related Art

Expansion cards are used to add more accessory functionality to a computer system via the expansion bus, such as graphics display card, SSD (Solid State Disk) card . . . etc. Since cooling and heat dissipation of expansion cards are getting more and more, a traditional cooling fin that adhered to the expansion card was insufficient to meet demand. For example, the stability of the assembly is not enough, and insufficient combination strength also affects the effectiveness of heat dissipation. Therefore, it is desirable in the industry field to propose a heat-dissipating device with enhanced stability and combination strength, to conveniently and stably combine with an expansion card.

SUMMARY OF THE INVENTION

One of the objectives of the present disclosure is to provide a heat-dissipating device for an expansion card, which can be conveniently and stably combined to the expansion card, and provides a buckling force being sufficient to fix on the expansion card, to increase the effectiveness of heat dissipation.

In order to achieve the above objectives, according to one exemplary embodiment of the present disclosure, a heat-dissipating device for expansion card is provided for dissipating heat from an expansion card. The expansion card has a circuit card, an inserting-type connector formed at one end of the circuit card and a securing hole formed at the other end of the circuit card. The heat-dissipating device for the expansion card includes a base plate, a plurality of cooling fin, a screwing portion and at least one hooking part. The base plate has a planar bottom surface. The base plate having a first side and a second side opposite to the first side. The cooling fins are protruded from a top surface of the base plate. The screwing portion is formed at the first side of the base plate, a position of the screwing portion corresponded with the securing hole of the expansion card. The at least one hooking part is formed on the second side of the base plate. The t least one hooking part is hooked with a side of the circuit card of the expansion card.

Another of the objectives of the present disclosure is to provide an expansion card assembly with heat-dissipating function, having a heat-dissipating device be able to conveniently and stably combined the expansion card, and provides enough clasping pressure to increase the effectiveness of heat dissipation.

In order to achieve the above objectives, according to one exemplary embodiment of the present disclosure, an expansion card assembly with heat-dissipating function includes an expansion card and a heat-dissipating device. The expansion card has a circuit card, an inserting-type connector formed on one end of the circuit card, and a securing hole formed at the other end of the circuit card. The heat-dissipating device includes a base plate, a plurality of cooling fins, a screwing portion and at least one hooking part. The base plate has a planar bottom surface. The base plate having a first side and a second side opposite to the first side. The cooling fins are protruded from a top surface of the base plate. The screwing portion is formed at the first side of the base plate, and a position of the screwing portion corresponded with the securing hole of the expansion card. The at least one hooking part is formed on the second side of the base plate and hooked with a side of the circuit card of the expansion card.

Thus, the present disclosure has advantages as follows. One side of the heat-dissipating device is fixed to the securing hole of the expansion card by a screw, and the other side is fixed to the circuit card of the expansion card by a hooking structure. Thus, the heat-dissipating device can be effectively and stably combined with the expansion card. The heat-dissipating device has enough buckling pressure, so as to enhance the heat dissipation performance.

For further understanding of the present disclosure, reference is made to the following detailed description illustrating the embodiments and examples of the present disclosure. The description is for illustrative purpose only and is not intended to limit the scope of the claim.

DETAILED DESCRIPTION OF THE EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 1:
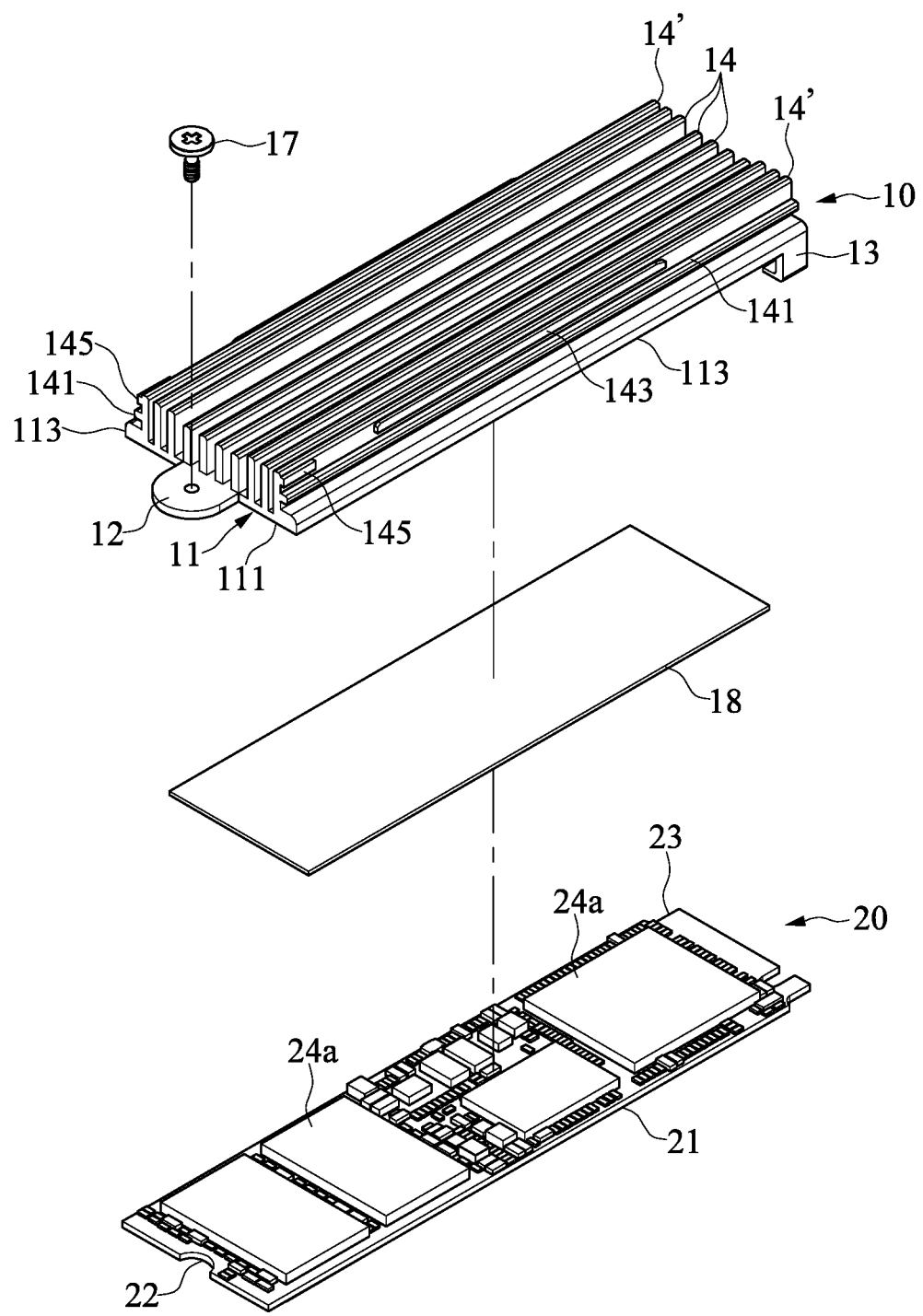
FIG. 1 is an exploded perspective view of a heat-dissipating device and an expansion card of the present disclosure.

Reference is made to FIG. 1, which is an exploded perspective view of a heat-dissipating device and an expansion card of the present disclosure. A heat-dissipating device 10 is assembled at one side of an expansion card 20. The heat-dissipating device 10 of this embodiment is designed to be suitable for the expansion card 20, so as to dissipating redundant heat from the expansion card 20. The expansion card 20 and the heat-dissipating device 10 are collectively called an expansion card assembly with heat-dissipating function.

In this embodiment, the expansion card 20 has a circuit card 21, a securing hole 22 and an inserting-type connector 23. The inserting-type connector 23 is formed on one end of the circuit card 21. The securing hole 22 is formed on the other end of the circuit card 21. The expansion card 20 has a plurality of electronic elements, such as upper chips 24a, which are disposed on a top surface thereof. The bottom surface of the expansion card 20 also could have a plurality of electronic elements, such as lower chips 24b. However, the expansion card 20 can only have electronic elements disposed on its top surface. The expansion card 20 can integrate functions, such as Solid State Disk (SSD), or wireless communication module . . . etc. Wireless communication module could be, for example, Wi-Fi, Bluetooth, global positioning system, and near field communication (NFC).

The expansion card 20, in this embodiment, is illustrated by taking a PCI-E card of the M.2 interface as an example. Heat generated by high-speed reading/writing of M.2 interface SSD is a common problem. Especially the SSD capacity performance is enhanced more and more, the heat dissipation requirement is higher and higher. The present disclosure provides the heat-dissipating device 10 which can improve the thermal problem. The predecessor of the M.2 interface was Next Generation Form Factor (NGFF), which is a specification of expansion card of computer and relative connector. However, the present disclosure is not limited thereto, for example, could be mini PCI-E (mini-Peripheral Component Interconnect), or mSATA (mini-Serial Advanced Technology Attachment).

In this embodiment, the heat-dissipating device 10 includes a base plate 11, a plurality of cooling fins (14, 14'), a screwing portion 12 and a pair of hooking parts 13. The base plate 11 has a planar bottom surface, a first side 111 and a second side 112 opposite to the first side 111. In this embodiment, the first side 111 and the second side 112 are two short sides of the base plate 11, which are corresponded to a screwing end and an inserting end of the expansion card 20. A plurality of cooling fins (14, 14') are upward protruded from a top surface of the base plate 11, so as to increase heat-dissipating area. The screwing portion 12 is formed on the first side 111 of the base plate 11. The positions of the screwing portion 12 are corresponding to the securing hole 22 of the expansion card 20. In this embodiment, the heat-dissipating device 10 can be made of aluminum or aluminum alloy, and proceeding with an aluminum extrusion method, cutting, and other processes.

In this embodiment, the heat-dissipating device 10 has a pair of hooking parts 13. The pair of hooking parts 13 are oppositely formed on two ends of the second side 112 of the base plate 11, and hooked to two side edges of the circuit card 21 of the expansion card 20. The hooking positions preferably avoid the electronic elements. In this embodiment, the hooking parts 13 are L-shaped and integrally connected with on side of the base plate 11, and close to the inserting-type connector 23 of the expansion card 20 when the heat-dissipating device 10 is assembled with the the expansion card 20. The hooking parts 13 do not contact the inserting-type connector 23.

However, the present disclosure is not limited thereto. The number of the hooking part 13 could be at least one, which is disposed on second side 112 of the base plate 11. For example, the hooking part could be extended longer to the bottom surface of the base plate 11, for example, extending to a half width of the base plate 11. One hooking part can be used to hook to one side of the circuit card 21 and the expansion card 20. In addition, the hooking part can be an external element and is connected to the base plate 11, and can be made of insulated material. For example, one hooking part has two ends respectively formed with an L-shaped part, and two ends are connected by a traverse rod, which is traversed across a top end of the cooling fin 14. L-shaped parts are extended to two outer sides of the base plate 11 and to the bottom surface of the base plate 11.

In a preferable way, the heat-dissipating device of the present disclosure further includes a heat-conductive layer 18. The heat-conductive layer 18 is disposed between the base plate 11 and the expansion card 20. Heat is conducted from a top surface of a chip on the circuit card 21, through heat-conductive layer 18 and conducted to the heat-dissipating device 10. The heat-conductive layer 18 could be a thermal tape or a thermal conductive pad . . . etc., so as to enhance the effectiveness of conducting heat to the base plate 11 and the cooling fin 1.

Reference is made to FIG. 3 to FIG. 6. The heat-dissipating device 10 and the expansion card 20 are assembled to an expansion card assembly with heat-dissipating function. The assembling process firstly is to obliquely put the inserting-type connector 23 of the expansion card 20 through the hooking part 13 of the heat-dissipating device 10, and then, the expansion card 20 is pressed to contact a bottom surface of the heat-dissipating device 10. After the heat-dissipating device 10 and the expansion card 20 are combined, the bottom surface of the base plate 11 of the heat-dissipating device 10 is contacted with the electronic elements, such as, the upper chip 24a, on the top surface of the expansion card 20 through the heat-conductive layer 18. When the expansion card assembly is assembled to a motherboard of computer (not shown), the inserting-type connector 23 of the expansion card 20 is inserting to a socket connector (not shown) of the motherboard. After the expansion card 20 has been assembled, the expansion card 20 is parallel to the motherboard. Then, a screw 17 passes through the screwing portion 12 of the heat-dissipating device 10 and the securing hole 22 of the expansion card 20, and the heat-dissipating device 10 and the expansion card 20 are simultaneously fixed to the motherboard.

Figure 7:
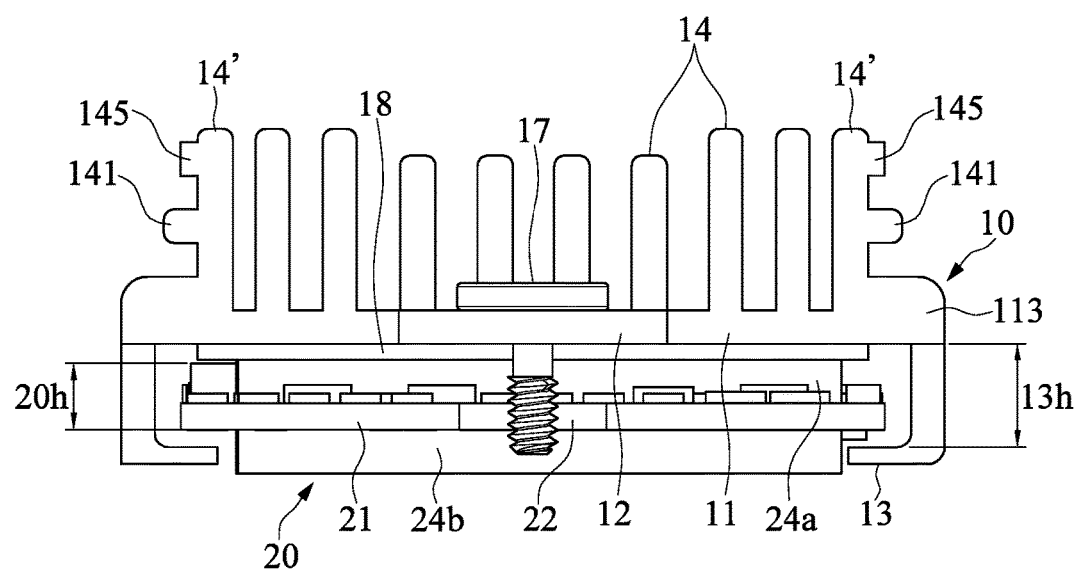
FIG. 7 is a rear view of the expansion card assembly with heat-dissipating function of the present disclosure.

Reference is made to FIG. 7. In this embodiment, an inner gap 13h of the hooking part 13 is larger than a thickness 20h of the circuit card 21 of the expansion card 20 and the chip on the circuit card 2. For example, M.2 interface 2280 type is 22 mm wide and 80 mm long. The thickness of the circuit card 21 is about 0.8 mm. The electronic elements on the top surface of the circuit card 21 have a thickness about 1.2 mm to 1.5 mm according to different types. The electronic elements on the bottom surface of the circuit card 21 have a thickness about 0.7 to 1.5 mm. In the case of single surface equipped with electronic elements, the thickness is about 2.75 mm. In the case of double surfaces equipped with flash memory, the thickness is not over 3.85 mm. The m.2 interface has abundant expansion ability with a longest 110 mm long, so as to increase the memory storage of SSD. For example, the total of 0.8 mm thick of the circuit card 21, 1.2 mm of the electronic element on the top surface, and the thickness of the heat-conductive layer 18 is about 0.5 mm to 2 mm. The inner gap 13h of the hooking part 13 is at least larger than 2.5 mm, which is about 2.5 mm to 4.3 mm. A bottom section of the hooking part 13 parallel to the circuit card 21 preferably is not larger than the maximum thickness of electronic element on the bottom of the circuit card 21, which is about 1.5 mm.

In addition, a length of the base plate 11 is smaller than the length of the expansion card 20, and in principle, the base plate 11 did not extend to the inserting-type connector 23. A width of the base plate 11 is larger than a width of the expansion card 20, so that the hooking part 13 is conveniently formed thereon.

Figure 2:
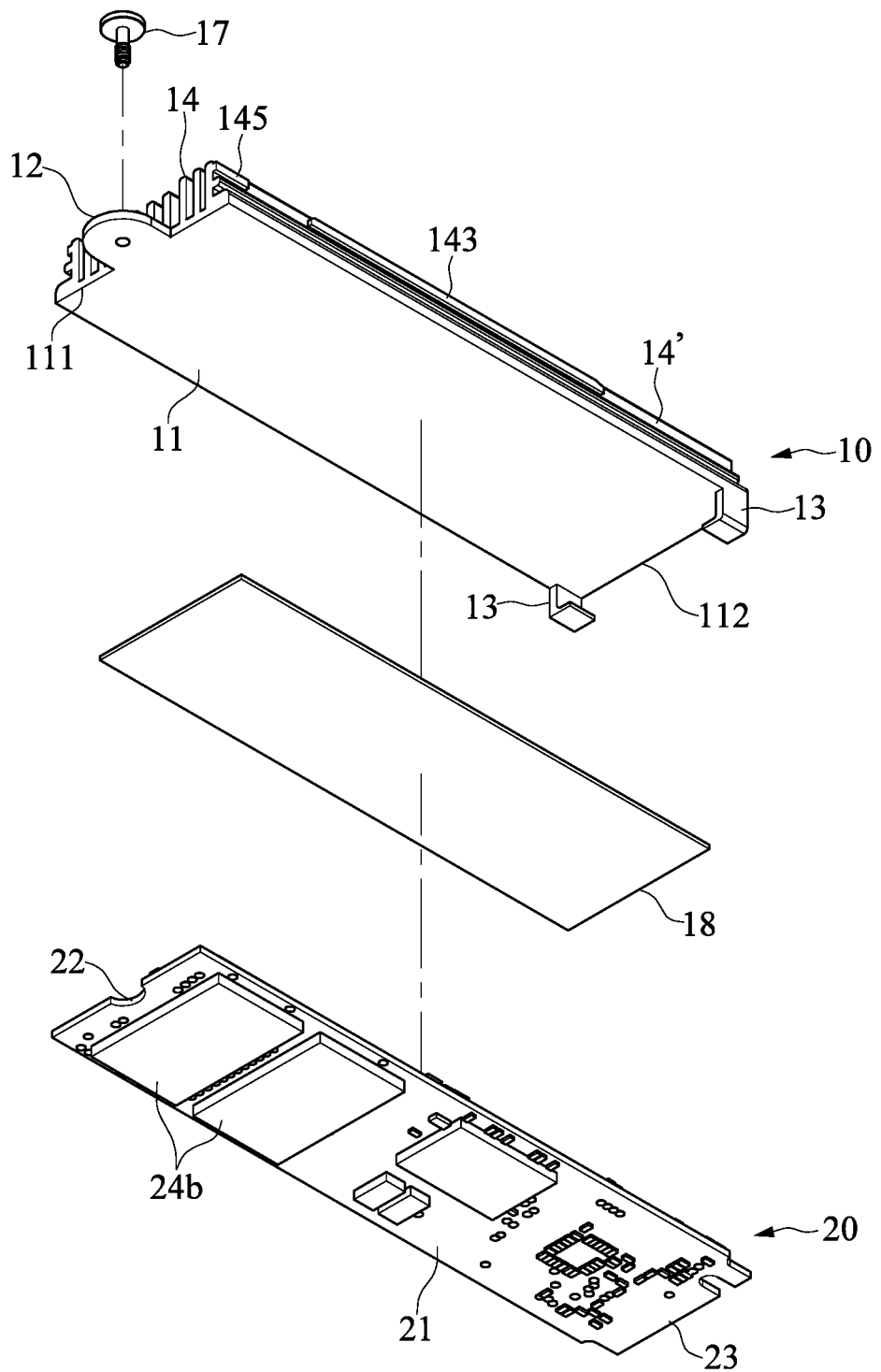
FIG. 2 is another exploded perspective view of the heat-dissipating device and the expansion card of the present disclosure.
Figure 3:
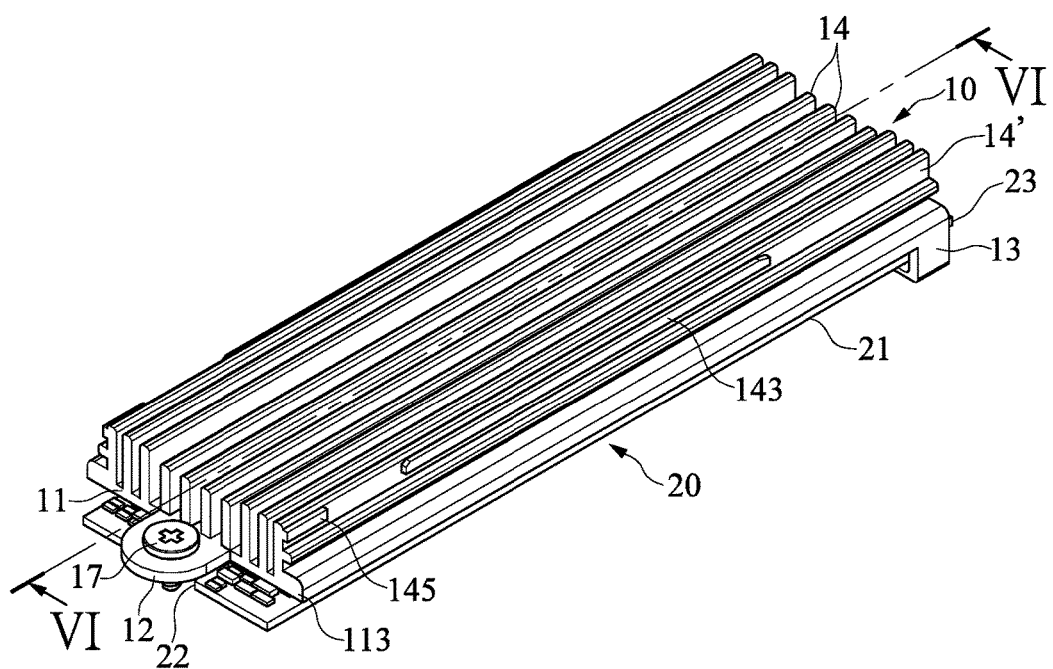
FIG. 3 is an assembled perspective view of the expansion card assembly with heat-dissipating function of the present disclosure.
Figure 4:
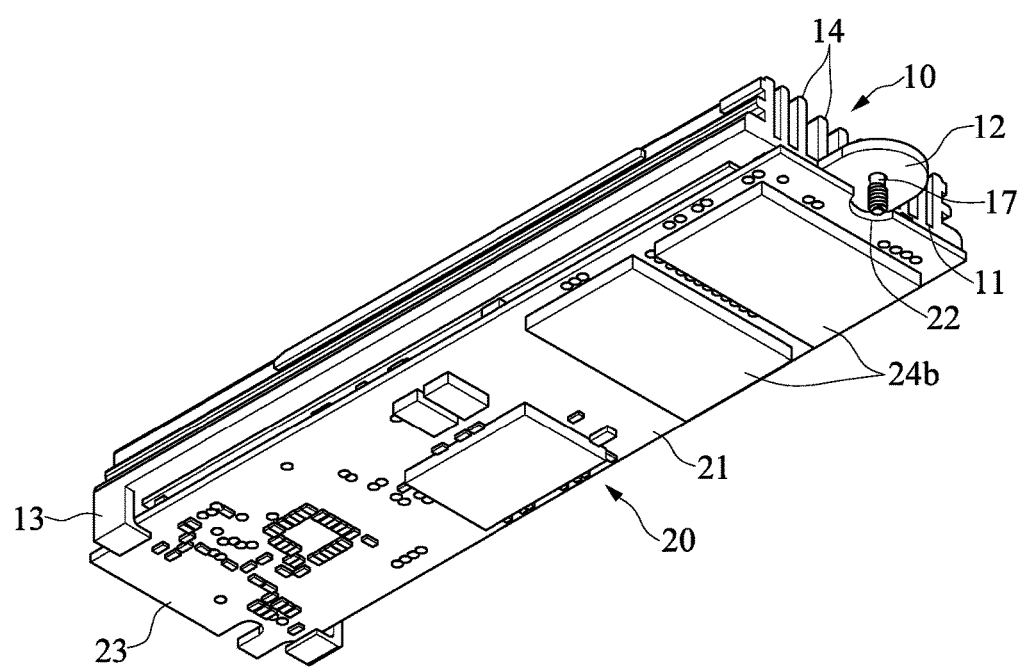
FIG. 4 is another assembled perspective view of the expansion card assembly with heat-dissipating function of the present disclosure.
Figure 5:
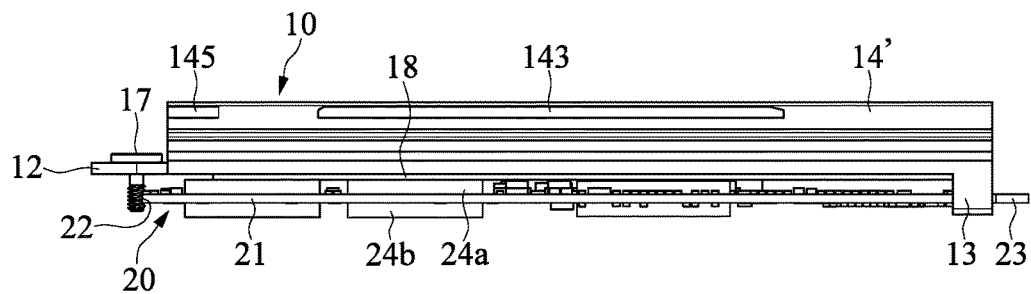
FIG. 5 is a side view of the expansion card assembly with heat-dissipating function of the present disclosure.
Figure 6:
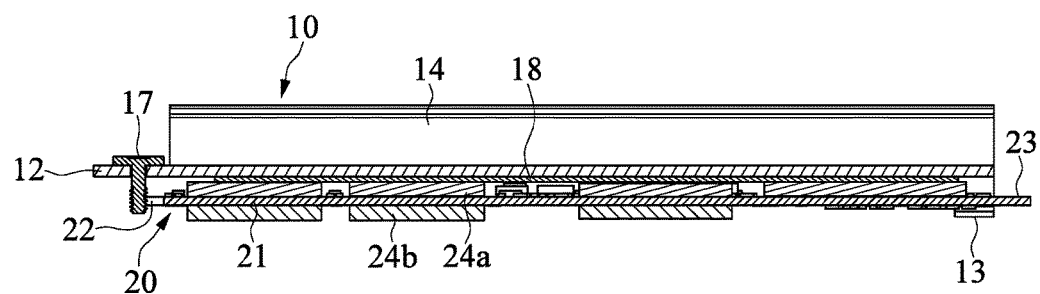
FIG. 6 is a cross-sectional view of the expansion card assembly with heat-dissipating function of the present disclosure.

Reference is made with FIG. 1 and FIG. 2. A supplementary description of the heat-dissipating device 10 in this embodiment is as follows. The plurality of cooling fins 14, 14' are extended along a longitudinal direction of the base plate 11. The base plate 11 has two opposite longitudinal side edges, and has a pair of thickening portions 113. Each of the thickening portions 113 is formed along the longitudinal side edges, and outward extends from a root part of the outermost cooling fin 14'. In other words, a thickness of the thickening portion 113 is larger than a thickness of a middle part of the base plate 11. The two outermost cooling fins 14' are outward protruded with at least one auxiliary cooling rib 141, respectively, so as to enlarge the heat-dissipating area.

Further, the two outermost cooling fins 14' respectively have a picking rib 143. The picking rib 143 is closed to a top edge of the outermost cooling fin 14'. A length of the picking rib 143 is smaller than a length of the cooling fin 14. For example, the picking rib 143 can be clipped by an assembling tool (not shown), and the heat-dissipating device 10 can be picked.

Moreover, the two outermost cooling fins 14' further have an identification rib 145. The identification rib 145 is closed to a top edge of the outermost cooling fin 14' and is extended close to an end of the screwing portion 12. The identification rib 145 is benefit to a direction identification of the heat-dissipating device 10.

To sum up, according to the present disclosure, the heat-dissipating device 10 and the expansion card assembly with heat-dissipating function has characteristic and features as follows. One side of the heat-dissipating device 10 is fixed to the securing hole 22 of the expansion card 20 by a screw 17, and the other side is fixed to the circuit card 21 of the expansion card 20 by a hooking structure. Thus, the heat-dissipating device 10 can be effectively and stably combined with the expansion card 20. The heat-dissipating device 10 has enough buckling pressure, so as to enhance the heat dissipation performance. The installation is very convenient for the user.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A heat-dissipating device, for dissipating heat from an expansion card, the expansion card having a circuit card, an inserting type connector formed at one end of the circuit card and a securing hole formed at the other opposite end of the circuit card, the heat-dissipating device comprising: a base plate; having a planar bottom surface, a first side and a second side opposite to the first side along length sides of the base plate; a plurality of cooling fins; protruded from a top surface of the base plate; a screwing portion; formed at the first side of the base plate, and corresponding in position with the securing hole of the expansion card; and at least one L-shaped hooking part; formed on at least one of the length sides of the base plate, configured to hook with a side of the circuit card of the expansion card opposite to the top surface, adjacent to an inserting-type connector of the expansion card, when the heat-dissipating device is assembled with the expansion card.

2. The heat-dissipating device as claimed in claim 1, wherein the at least one hooking part comprises a pair of hooking parts, and the pair of hooking parts are disposed at two opposite ends of the second side of the base plate and configured to hook to two opposite side edges of the circuit card of the expansion card, when the heat-dissipating device is assembled with the expansion card.

3. The heat-dissipating device as claimed in claim 1, wherein the hooking part has an inner gap larger than a thickness of the circuit card of the expansion card and a chip on a top surface of the circuit card.

4. The heat-dissipating device as claimed in claim 1, wherein a length of the base plate is smaller than a length of the expansion card, a width of the base plate is larger than a width of the expansion card.

5. The heat-dissipating device as claimed in claim 1, wherein the plurality of the cooling fins extend along a longitudinal direction of the base plate; and wherein the base plate has two opposite longitudinal side edges and a pair of thickening portions formed along the longitudinal side edges, and each of the thickening portions inwardly extend to a root part of an outermost cooling fin.

6. The heat-dissipating device as claimed in claim 5, wherein two outermost ones of the cooling fins are outwardly protruded with two auxiliary cooling ribs, respectively.

7. The heat-dissipating device as claimed in claim 1, wherein each outermost one of the cooling fins have an identification rib, and the identification rib is adjacent to a top edge of the outermost one of the cooling fins and adjacent to an end of the screwing portion.

8. The heat-dissipating device as claimed in claim 1, further comprising a heat-conductive layer disposed between the base plate and the expansion card, when the heat-dissipating device is assembled with the expansion card.

9. An expansion card assembly, comprising: an expansion card; including a circuit card, an inserting-type connector formed on one end of the circuit card, and a securing hole formed at the other end of the circuit card; and a heat-dissipating device, including: a base plate; having a planar bottom surface, a first side and a second side opposite to the first side along length sides of the base plate; a plurality of cooling fins; protruded from a top surface of the base plate; a screwing portion—formed at the first side of the base plate, and corresponding in position with the securing hole of the expansion card; and at least one L-shaped hooking part; formed on at least one of the length sides of the base plate, hooked with a side of the circuit card of the expansion card opposite to the top surface, and adjacent to the inserting-type connector of the expansion card, when the heat-dissipating device is assembled with the expansion card.

* * * * *